United States Patent [19]
Haley et al.

[11] Patent Number: 6,043,560
[45] Date of Patent: *Mar. 28, 2000

[54] THERMAL INTERFACE THICKNESS CONTROL FOR A MICROPROCESSOR

[75] Inventors: Kevin J. Haley, San Jose, Calif.; Niel C. Delaplane, Tualatin, Oreg.; Ravindranath V. Mahajan, Tempe, Ariz.; Robert Starkston, Chandler, Ariz.; Charles A. Gealer, Phoenix, Ariz.; Joseph C. Krauskopf, Portola Valley, Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/984,428

[22] Filed: Dec. 3, 1997

[51] Int. Cl.⁷ .......................... H01L 23/30; H01L 23/28; H01L 23/34
[52] U.S. Cl. .......................... 257/706; 257/712; 257/704; 257/709; 257/730; 257/731; 257/699; 257/719; 257/729; 361/783; 361/767
[58] Field of Search .......................... 257/676, 712, 257/713, 717, 719, 706, 678, 687, 699, 704, 708, 710, 726, 727, 729, 709, 730, 731; 361/783, 747, 820

[56] References Cited

U.S. PATENT DOCUMENTS

| | | | |
|---|---|---|---|
| 4,692,790 | 9/1987 | Oyamada | 257/727 |
| 4,866,571 | 9/1989 | Butt | 361/717 |
| 4,977,748 | 12/1990 | Diedrich | 62/51.1 |
| 5,134,463 | 7/1992 | Yamaguchi | 257/712 |
| 5,182,632 | 1/1993 | Bechtel et al. | 257/713 |
| 5,208,732 | 5/1993 | Bandonin et al. | 257/713 |
| 5,291,065 | 3/1994 | Arai et al. | 257/723 |
| 5,296,739 | 3/1994 | Heibronner et al. | 257/706 |
| 5,397,919 | 3/1995 | Tata et al. | 257/717 |
| 5,566,052 | 10/1996 | Hughes | 361/704 |
| 5,585,671 | 12/1996 | Nagesh et al. | 257/679 |
| 5,615,056 | 3/1997 | Collins et al. | 257/713 |
| 5,619,399 | 4/1997 | Mok | 257/718 |
| 5,646,445 | 7/1997 | Masumoto et al. | 257/713 |
| 5,786,635 | 7/1998 | Alcoe et al. | 257/718 |
| 5,793,106 | 8/1998 | Yosukawa et al. | 257/719 |
| 5,834,842 | 11/1998 | Majumdar et al. | 257/718 |
| 5,883,396 | 3/1999 | Reedy et al. | 257/9 |
| 5,900,312 | 5/1999 | Sylvester | 428/322.7 |
| 5,907,474 | 5/1999 | Dolbear | 361/705 |
| 5,915,170 | 6/1999 | Raab et al. | 438/118 |
| 5,919,329 | 7/1999 | Banks et al. | 156/281 |
| 5,923,086 | 7/1999 | Winer et al. | 257/713 |
| 5,936,849 | 8/1999 | Fetterman | 361/783 |

*Primary Examiner*—Alexander Oscar Williams
*Attorney, Agent, or Firm*—Blakely, Sokoloff, Taylor & Zafman LLP

[57] ABSTRACT

A method and apparatus for controlling the thickness of a thermal interface between a processor die and a thermal plate in a microprocessor assembly are provided. The apparatus includes a generally rectangular shaped thermal top cover having a recessed portion of predetermined depth and aperture therein. The thermal top cover fits over the processor die. A thermal interface layer fills the recessed portion of the thermal top cover covering the processor die. The depth of the recessed portion is greater than the thickness of the processor die so that the thickness of the thermal interface layer is controlled. A thermal plate is placed over the thermal top cover in contact with the thermal grease so as to form a thermal path from the processor die to the thermal plate.

11 Claims, 3 Drawing Sheets

THERMAL INTERFACE THICKNESS CONTROL FOR A MICROPROCESSOR

BACKGROUND OF THE INVENTION

1. Field of the Invention

This invention relates generally to the thermal interface between a semiconductor device and a thermal plate, and more particularly, to an apparatus and method for controlling the thickness of the thermal interface layer between a processor die and the thermal plate in a microprocessor device.

2. Description of the Related Art

In microprocessor devices, especially of the control collapse chip connection (C4) type, it is desirable to control the thickness of the thermal interface between the processor die and thermal plate. A continous and consistent thermal path will not be formed between the processor die and thermal plate if a controlled interface thickness is not maintained. This will impede the cooling of the processor die and other components of the microprocessor. It is therefore desirable that the thickness and thickness tolerance of the thermal interface be tightly controlled.

In the semiconductor industry, it is common for original equipment manufacturers (OEMs) to purchase microprocessors that have not been fully packaged. Often, the OEMs complete the packaging steps during the final assembly steps of the end product. As a result, many OEMs are left with the task of applying the thermal interface layer between the processor die and thermal plate. For the tolerance of the thermal interface layer to be tightly controlled, this packaging step is complex and costly for the OEMs.

The present invention is directed at reducing the complexity and thus cost associated with precisely and reliably controlling the thickness of the thermal interface layer for the OEMs during final assembly of the end product.

SUMMARY OF THE INVENTION

In one aspect of the present invention, an apparatus for controlling the thickness of a thermal interface between a semiconductor device and thermal plate in a microprocessor assembly is provided. The apparatus includes a thermal top cover having a recessed portion of predetermined depth that at least partially encloses the semiconductor device.

In another aspect of the present invention, a method for controlling the thickness of a thermal interface between a semiconductor device and thermal plate in a microprocessor assembly is provided. The method includes securing a thermal top cover having a recessed portion of predetermined depth around the semiconductor device.

BRIEF DESCRIPTION OF THE DRAWINGS

Other objects and advantages of the invention will become apparent upon reading the following detailed description and upon reference to the drawings in which.

Figure 1:
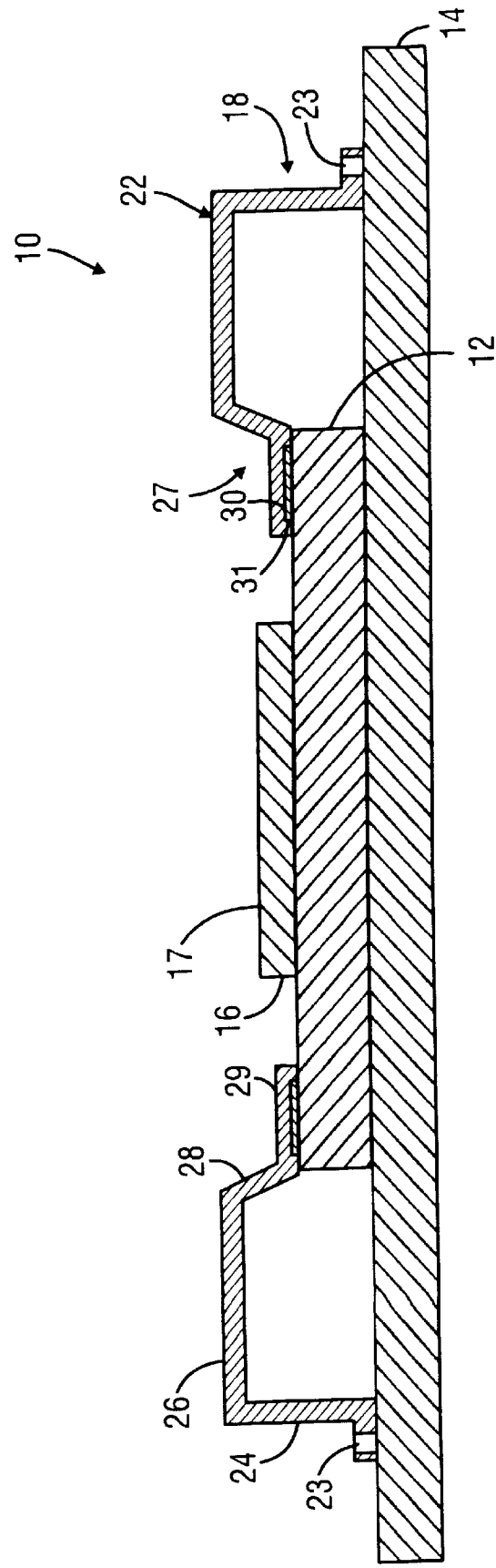
FIG. 1 is a cross-sectional view of a partially constructed microprocessor assembly illustrating an embodiment of a thermal top cover according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings and referring initially to FIG. 1, an improved microprocessor assembly is shown generally by reference numeral 10. The microprocessor assembly 10 includes an OLGA (Organic Land Grid Array) or printed circuit board 12 that is mounted to a substrate 14. The microprocessor 10 also includes a processor die 16, e.g., a C4 processor, which is in turn mounted to the OLGA 12. The processor die 16 has a substantially flat top surface 17, as shown in FIG. 1. The processor die 16 is an integrated circuit that is the processing core of the microprocessor assembly 10.

Figure 2:
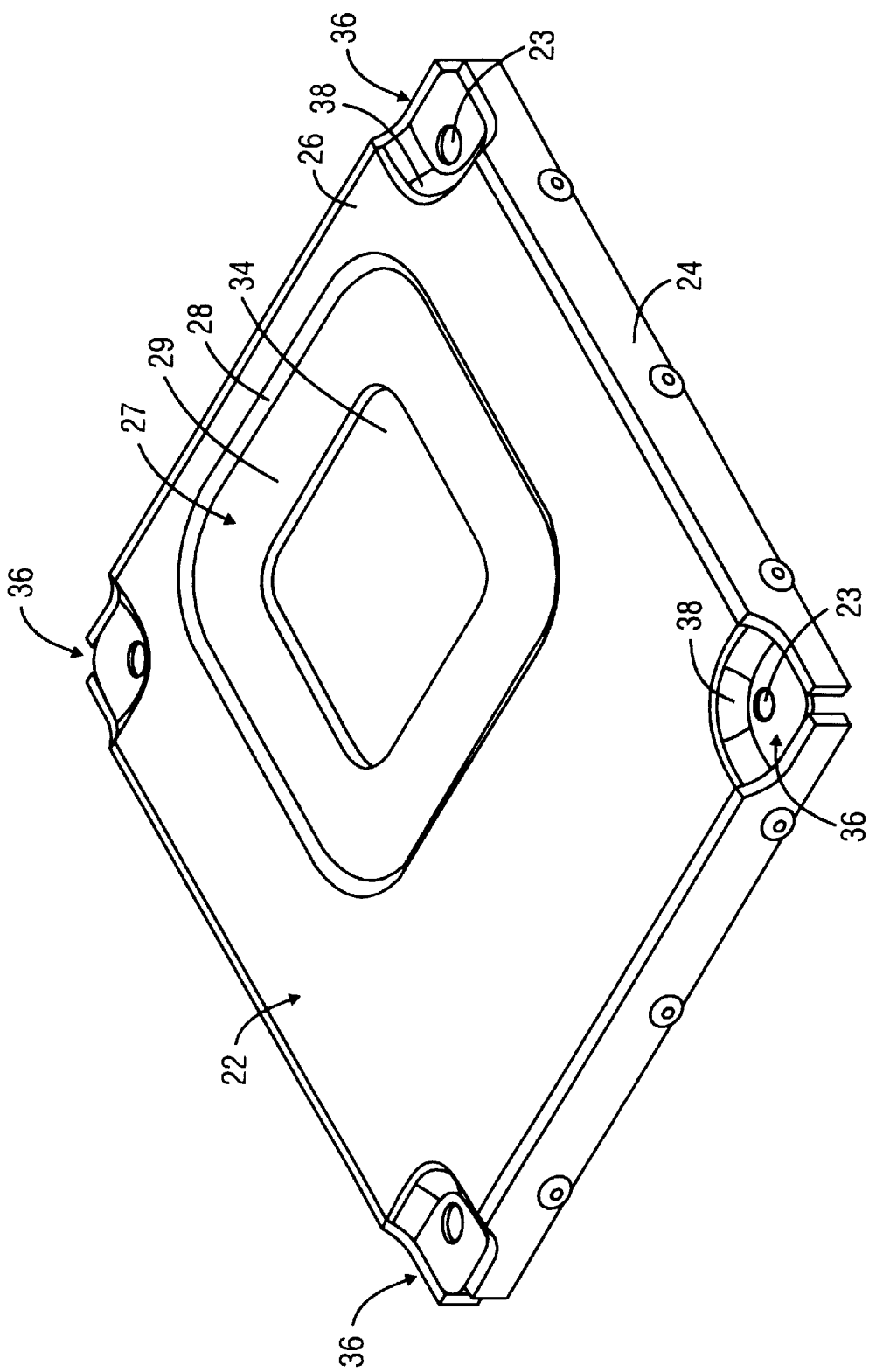
FIG. 2 is a perspective view of the thermal top cover shown in FIG. 1.
Figure 3:
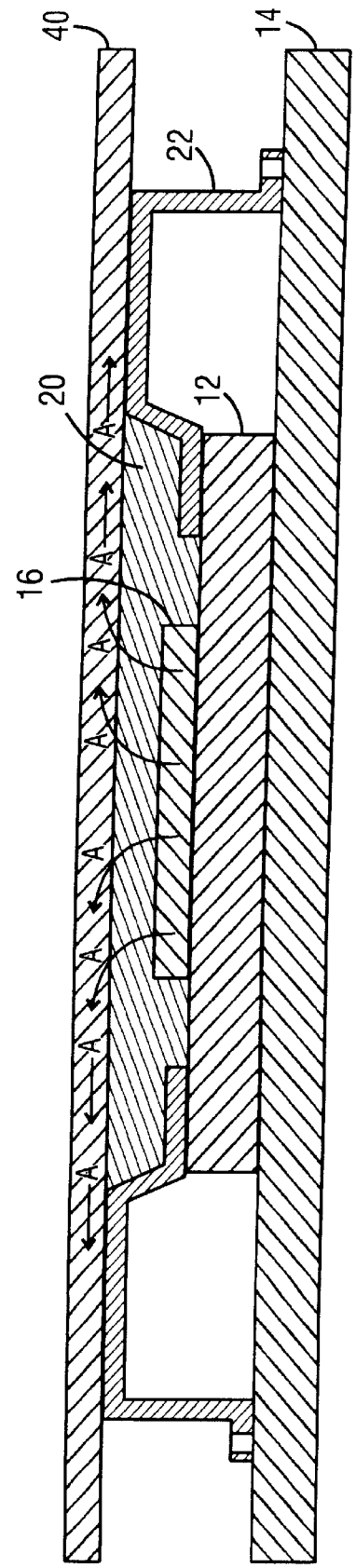
FIG. 3 is a cross-sectional view of an embodiment of a completed microprocessor assembly according to the present invention.

The microprocessor assembly 10 further includes an apparatus 18 for controlling the thickness of a thermal interface 20 (shown in FIG. 3). The apparatus 18 includes a thermal top cover 22 that is secured to the substrate layer 14 by four screws (not shown), which are received into holes 23 extending through the top cover 22 and into the substrate 14. The thermal top cover 22 is disposed in contact with the OLGA 12. In one embodiment, the thermal top cover 22 is rectangular in shape, as shown in FIG. 2, and is formed substantially of stainless steel. However, as those of ordinary skill in the art will recognize, other devices may be used to secure the thermal top cover 22 to the substrate 14 and the thermal top cover 22 may be formed of other thermally conductive or non-conductive materials.

The thermal top cover 22 is defined by a substantially flat outer periphery 24, as illustrated in FIG. 1. It is further defined by a substantially flat top surface 26 and a recess 27, as shown in FIGS. 1 and 2. The recess 27 is in turn defined by a sloped portion 28, and a substantially horizontal section 29. A pair of channels 30 are formed in the substantially horizontal section 29, as shown in FIG. 1. The channels 30 are adapted to fit around and interface with a corresponding pair of ink swatches 31 of the type known in the art, which are disposed on the OLGA 12. In one embodiment, the channels 30 and corresponding ink swatches 31 are approximately 3.5 mm wide and 15 mm long. A generally rectangular-shaped aperture 34 is formed in the recess 27, as illustrated in FIG. 2.

In one embodiment, the thermal top cover 22 is approximately 55.76 mm wide, 59.67 mm long, and 5.5 mm high. In this embodiment, the recess 27 is approximately 32.10 mm wide, 32.10 mm long, and 0.91 mm deep. The thermal top cover 22 is designed so that the substantially flat top surface 26 is disposed above the top surface 17 of the processor die 16, as shown in FIG. 1. This is what enables the thickness of the thermal interface 20 to be accurately and reliably controlled, as further discussed below.

The thermal top cover 22 is formed with recesses 36 at each of its four corners, as shown in FIG. 2. The recesses 36 have an arcuate section 38 disposed opposite to each respective corner. Also, each of the recesses 36 is provided with the holes 23 described above, which are adapted to receive the screws (not shown). The recesses 36 facilitate mounting of the thermal top cover 22 to the substrate 14.

In one embodiment, the thermal top cover 22 is formed by a stamping process. In an alternate embodiment, the thermal top cover 22 is formed by cold forging, die casting, or other similar high volume manufacturing technique.

The assembly shown in FIG. 1 illustrates what may typically be shipped to an OEM customer. The OEM customer may then fill the recess 27 with a thermal interface layer 20, as shown in FIG. 3. In one embodiment, the thermal interface layer 20 is a thermal grease formed of a silicon-based material, e.g., Shin-Etsu G749™ manufactured by Shin-Etsu of Japan, which may be applied by a dispensing machine. In another embodiment, the thermal interface layer 20 is a THERMFLOW™ film, which may be obtained from Chromerics, located in Massachusetts. The recess 27 controls the thickness of the thermal layer 20 so that the thermal layer 20 sufficiently covers the processor die 16 and also interfaces with a thermal plate 40. The depth of the recess 27 is greater than the thickness of the processor die 16. This ensures that the thermal plate 40 does not contact the surface of the processor die 16 and thus cause it to be damaged.

The thermal top cover 22 enables the OEM customer to maintain a close tolerance in the thickness of the thermal layer 20 during its formation. It is desirable to maintain such a close tolerance because the resistance of the thermal layer 20 is directly related to its thickness. Thus, the thicker the thermal layer 20 is the greater its thermal resistance. The optimal thickness of the thermal layer is between 0.003 and 0.008 inches. As long as the thickness of the thermal layer is maintained in this range, maximum heat transfer from the processor die 16 to the thermal plate 40 can be achieved.

The thermal plate 40 is disposed above the OLGA 12 and processor die 16 and is provided for cooling the various electrical components of the microprocessor assembly 10. The thermal plate 40 performs this function by dissipating heat along its entire surface, which is many times the size of the OLGA 12 and processor die 16. In one embodiment, the thermal plate 40 is approximately the same size as the substrate 14. As shown in FIG. 3, heat is transferred from the processor die 16 to the thermal plate 40 along the thermal path indicated by the arrows A. In this embodiment, the thermal plate 40 is formed of aluminum.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processor assembly, comprising:
    one of a printed circuit board and an organic land grid array;
    a substrate coupled to said one of a printed circuit board and an organic land grid array;
    a semiconductor device coupled to said one of a printed circuit board and an organic land grid array, said semiconductor device having a flat surface; and
    a thermal top cover having:
        a bottom portion mounted to said substrate; and
        a top surface forming a rim a first predetermined distance from said flat surface.

2. The assembly of claim 1, further comprising a thermal plate coupled to said top surface, wherein said thermal plate is said first predetermined distance from said flat surface.

3. The assembly of claim 2, further including a thermal interface material disposed between said flat surface and said thermal plate.

4. The assembly of claim 1 wherein:
    said top cover includes a recessed portion having an opening therein in which said semiconductor device is disposed;
    said recessed portion includes an intermediate surface disposed between said top surface and said bottom portion; and
    said first predetermined distance is determined by a second predetermined distance between said top surface and said intermediate surface;
    wherein said second predetermined distance is greater than a thickness of said semiconductor device.

5. The assembly of claim 4, wherein:
    said intermediate surface is in contact with said one of a printed circuit board and an organic land grid array.

6. The assembly of claim 1, wherein said top cover includes an opening exposing said flat surface.

7. The assembly of claim 1, wherein said first predetermined distance is between about 0.003–0.008 inches.

8. A method for controlling the thickness of a thermal interface between a semiconductor device and a thermal plate, comprising:
    coupling said semiconductor device to one of a printed circuit board and an organic land grid array;
    coupling said one of a printed circuit board and an organic land grid array to a substrate;
    coupling a thermal top cover to said substrate;
    applying a thermal interface material to a flat surface of said semiconductor device; and
    coupling said thermal plate to said top cover a predetermined distance from said flat surface.

9. The method of claim 8, wherein coupling said thermal plate includes:
    coupling said thermal plate to a top surface of said thermal top cover; and
    placing said thermal plate in intimate contact with said thermal interface material.

10. The method of claim 8, wherein applying a thermal interface material includes filling a recessed portion of said top cover with said thermal interface material.

11. The method of claim 8, wherein coupling said thermal plate includes coupling said thermal plate to said top cover between about 0.003–0.008 inches from said flat surface.

* * * * *

UNITED STATES PATENT AND TRADEMARK OFFICE
CERTIFICATE OF CORRECTION

PATENT NO. : 6,043,560
DATED : March 28, 2000
INVENTOR(S) : Haley et al.

It is certified that error appears in the above-identified patent and that said Letters Patent is hereby corrected as shown below:

On The title page, at 75, delete inventor "Niel C. Delaplane" and insert --Neil C. Delaplane--.

Signed and Sealed this

Thirteenth Day of February, 2001

*Attest:*

NICHOLAS P. GODICI

*Attesting Officer*        Acting Director of the United States Patent and Trademark Office